(12) United States Patent
How et al.

(10) Patent No.: US 11,830,791 B2
(45) Date of Patent: Nov. 28, 2023

(54) LEADS FOR LEADFRAME AND SEMICONDUCTOR PACKAGE

(71) Applicant: TEXAS INSTRUMENTS INCORPORATED, Dallas, TX (US)

(72) Inventors: You Chye How, Melaka (MY); Anis Fauzi Bin Abdul Aziz, Kedah (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/514,436

(22) Filed: Jul. 17, 2019

(65) Prior Publication Data
US 2020/0135621 A1 Apr. 30, 2020

(51) Int. Cl.
*H01L 23/495* (2006.01)
*H01L 21/50* (2006.01)
*H02H 5/04* (2006.01)
*H01L 21/60* (2006.01)

(52) U.S. Cl.
CPC ........ *H01L 23/49513* (2013.01); *H01L 21/50* (2013.01); *H01L 23/49534* (2013.01); *H01L 23/49541* (2013.01); *H01L 23/49548* (2013.01); *H01L 23/49555* (2013.01); *H01L 23/49558* (2013.01); *H01L 23/49582* (2013.01); *H02H 5/042* (2013.01); *H02H 5/047* (2013.01); *H01L 2021/60015* (2013.01)

(58) Field of Classification Search
CPC ......... H01L 23/49534; H01L 23/49582; H01L 23/49541; H01L 23/49548; H01L 23/49555
See application file for complete search history.

(56) References Cited

U.S. PATENT DOCUMENTS

| | | | | |
|---|---|---|---|---|
| 3,271,625 A | * | 9/1966 | Caracciolo | H01L 23/057 361/735 |
| 3,371,625 A | * | 3/1968 | Jones | A21C 11/166 425/288 |
| 4,413,404 A | * | 11/1983 | Burns | H01L 23/49541 228/160 |
| 5,057,805 A | * | 10/1991 | Kadowaki | H01L 23/66 333/247 |
| 5,202,577 A | * | 4/1993 | Ichigi | H01L 21/4842 257/666 |
| 5,271,148 A | * | 12/1993 | Desrochers | H01L 21/4842 257/E23.043 |
| 5,654,585 A | * | 8/1997 | Nishikawa | H01L 23/49555 257/E23.047 |
| 5,656,550 A | * | 8/1997 | Tsuji | H01L 21/565 257/786 |

(Continued)

OTHER PUBLICATIONS

U.S. Appl. No. 16/448,024, "Synchronous Rectifier Control Circuit", filed Jun. 21, 2019, 38 pages.

*Primary Examiner* — David A Zarneke
(74) *Attorney, Agent, or Firm* — Ronald O. Neerings; Frank D. Cimino (57) ABSTRACT

A semiconductor package includes a die pad and leads extending from the die pad. Each lead has a free end with outer surfaces extending at angles from one another. An electrically conductive plating material covers at least portions of the outer surfaces. A die attached to the die pad is electrically connected to the leads. An insulating layer extends over the leads and the die such that the free ends of the leads are exposed.

28 Claims, 8 Drawing Sheets

(56) References Cited

U.S. PATENT DOCUMENTS

| | | | | |
|---|---|---|---|---|
| 5,847,458 A * | 12/1998 | Nakamura | H01L 21/6835 | 257/784 |
| 5,882,955 A * | 3/1999 | Huang | H01L 23/49582 | 438/111 |
| 6,342,730 B1 * | 1/2002 | Jung | H01L 23/3107 | 257/734 |
| 6,448,107 B1 * | 9/2002 | Hong | H01L 23/3107 | 257/E23.046 |
| 6,664,136 B2 * | 12/2003 | Motonami | H01L 23/49586 | 438/123 |
| 6,696,749 B1 * | 2/2004 | Hung | H01L 23/3107 | 257/784 |
| 6,713,322 B2 * | 3/2004 | Lee | H01L 23/3107 | 257/666 |
| 6,756,660 B2 * | 6/2004 | Yasunaga | H01L 23/49541 | 257/666 |
| 6,924,548 B2 * | 8/2005 | Hasebe | H01L 23/49548 | 257/676 |
| 7,060,535 B1 * | 6/2006 | Sirinorakul | H01L 24/97 | 257/702 |
| 7,087,986 B1 * | 8/2006 | Bayan | H01L 23/3107 | 257/676 |
| 7,190,057 B2 * | 3/2007 | Seki | C25D 5/12 | 257/678 |
| 7,247,931 B2 * | 7/2007 | Ng | H01L 23/49548 | 257/784 |
| 7,268,415 B2 * | 9/2007 | Abbott | H01L 23/49582 | 257/666 |
| 7,501,692 B2 * | 3/2009 | Choi | H01L 23/49582 | 361/524 |
| 7,786,556 B2 * | 8/2010 | Yoshino | H01L 23/49582 | 257/676 |
| 7,791,178 B2 * | 9/2010 | Bang | H01L 23/49586 | 257/666 |
| 7,973,394 B2 * | 7/2011 | Li | H01L 23/3142 | 257/666 |
| 7,993,979 B2 * | 8/2011 | Do | H01L 24/16 | 257/773 |
| 8,043,898 B2 * | 10/2011 | Lee | H01L 21/4832 | 438/121 |
| 8,115,299 B2 * | 2/2012 | Kasuya | H01L 23/49548 | 257/693 |
| 8,309,401 B2 * | 11/2012 | Chou | H01L 23/3107 | 438/123 |
| 8,319,340 B2 * | 11/2012 | Shim | H01L 23/49548 | 257/739 |
| 8,338,232 B2 * | 12/2012 | Shi | H01L 23/49562 | 257/E21.503 |
| 8,415,205 B2 * | 4/2013 | Camacho | H01L 23/49541 | 438/123 |
| 8,435,867 B2 * | 5/2013 | Fujishima | H01L 24/32 | 438/461 |
| 8,497,165 B2 * | 7/2013 | Cruz | H01L 23/49548 | 438/123 |
| 8,581,379 B2 * | 11/2013 | Kure | H01L 23/49582 | 257/676 |
| 8,587,100 B2 * | 11/2013 | Yang | H01L 25/50 | 257/676 |
| 8,617,933 B2 * | 12/2013 | Camacho | H01L 23/49548 | 438/123 |
| 8,637,965 B2 * | 1/2014 | Shimanuki | H01L 23/49503 | 257/676 |
| 8,803,300 B2 * | 8/2014 | Bathan | H01L 23/49503 | 257/676 |
| 8,841,758 B2 * | 9/2014 | Daniels | H01L 24/97 | 257/676 |
| 8,877,555 B2 * | 11/2014 | Shi | H01L 21/568 | 257/E21.503 |
| 9,012,268 B2 * | 4/2015 | Jaurigue | H01L 21/561 | 257/676 |
| 9,059,185 B2 * | 6/2015 | Abbott | H01L 21/56 | |
| 9,190,351 B2 * | 11/2015 | Bai | H01L 21/565 | |
| 9,478,517 B2 * | 10/2016 | Paek | H01L 23/4951 | |
| 9,552,999 B2 * | 1/2017 | Kim | H01L 23/66 | |
| 9,601,415 B2 * | 3/2017 | Makino | H01L 21/50 | |
| 9,972,558 B1 * | 5/2018 | Talledo | H01L 21/4825 | |
| 10,008,437 B2 * | 6/2018 | Hayashi | H01L 23/3121 | |
| 10,079,198 B1 * | 9/2018 | Cadag | H01L 21/78 | |
| 10,249,556 B1 * | 4/2019 | Vareesantichai | H01L 23/49541 | |
| 10,304,760 B2 * | 5/2019 | Fukuzaki | H01L 23/49548 | |
| 10,304,762 B2 * | 5/2019 | Ito | H01L 23/49572 | |
| 10,395,971 B2 * | 8/2019 | Ko | H05K 3/38 | |
| 10,431,560 B2 * | 10/2019 | Lee | H01L 24/06 | |
| 10,504,869 B2 * | 12/2019 | Hashizume | H01L 23/49503 | |
| 10,790,219 B2 * | 9/2020 | Imori | H01L 23/49503 | |
| 10,903,148 B2 * | 1/2021 | Lam | H01L 23/49568 | |
| 10,937,745 B2 * | 3/2021 | Shi | H01L 24/97 | |
| 10,985,094 B2 * | 4/2021 | Hayashi | H01L 24/16 | |
| 11,062,980 B2 * | 7/2021 | Shibuya | H01L 21/4842 | |
| 11,088,054 B2 * | 8/2021 | Tseng | H01L 21/4828 | |
| 2009/0016083 A1 | 1/2009 | Soldano et al. | | |
| 2009/0316441 A1 | 12/2009 | Hu | | |
| 2011/0201159 A1 * | 8/2011 | Mori | H01L 23/49582 | 438/123 |
| 2012/0153449 A1 * | 6/2012 | Chou | H01L 24/49 | 257/676 |
| 2015/0023062 A1 | 1/2015 | Hyugaji et al. | | |
| 2015/0076675 A1 * | 3/2015 | Real | H01L 21/4832 | 257/676 |
| 2016/0183369 A1 * | 6/2016 | Talledo | H01L 23/49582 | 361/767 |
| 2018/0182731 A1 * | 6/2018 | Matsubara | H01L 23/49513 | |
| 2020/0083150 A1 * | 3/2020 | Shimizu | H01L 21/561 | |
| 2020/0098672 A1 * | 3/2020 | Hayashi | H01L 23/49541 | |

* cited by examiner

LEADS FOR LEADFRAME AND SEMICONDUCTOR PACKAGE

SUMMARY

In one example, a semiconductor package includes a die pad and leads extending from the die pad. Each lead has a free end with outer surfaces extending at angles from one another. An electrically conductive plating material covers at least portions of the outer surfaces. A die attached to the die pad is electrically connected to the leads. An insulating layer extends over the leads and the die such that the free ends of the leads are exposed.

In another example, a method of manufacturing a semiconductor package includes providing a lead frame having a die pad and leads extending from the die pad to a dam bar. The leads have a first thickness and outer surfaces extending at angles from one another. The dam bar includes a first portion having the first thickness and a second portion having a second thickness less than the first thickness to form a cavity. A die is attached to the die pad. The die is electrically connected to the leads. The lead frame is overmolded with an electrically insulating material that fills the cavity and leaves free ends of the leads exposed. The electrically insulating material is removed from the cavity. The overmolded lead frame is plated with an electrically conductive material that covers at least portions of the outer surfaces. The dam bar is removed.

Other objects and advantages and a fuller understanding of the invention will be had from the following detailed description and the accompanying drawings.

DETAILED DESCRIPTION

Figure 1A:
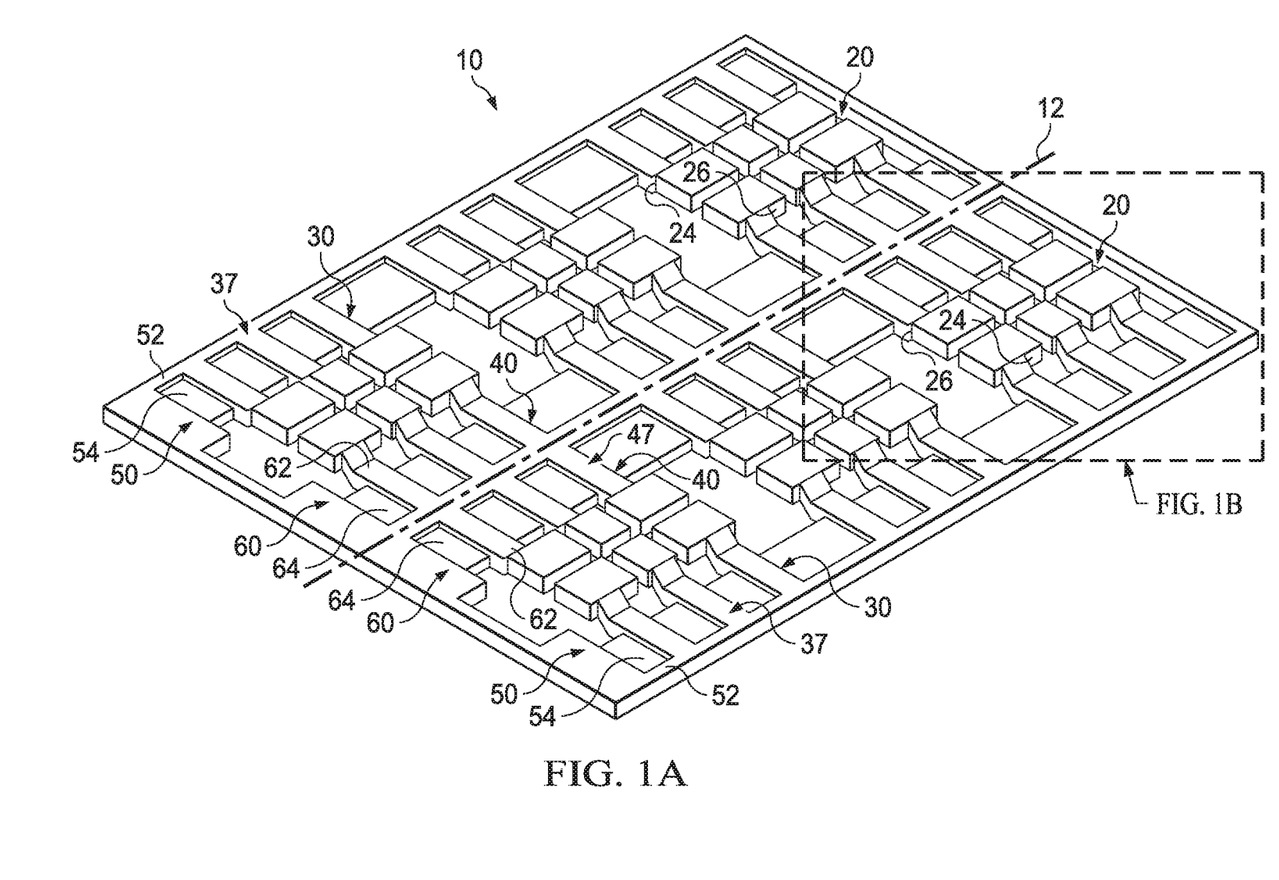
FIG. 1A is a top view of an example lead frame for forming a semiconductor package.
Figure 1B:
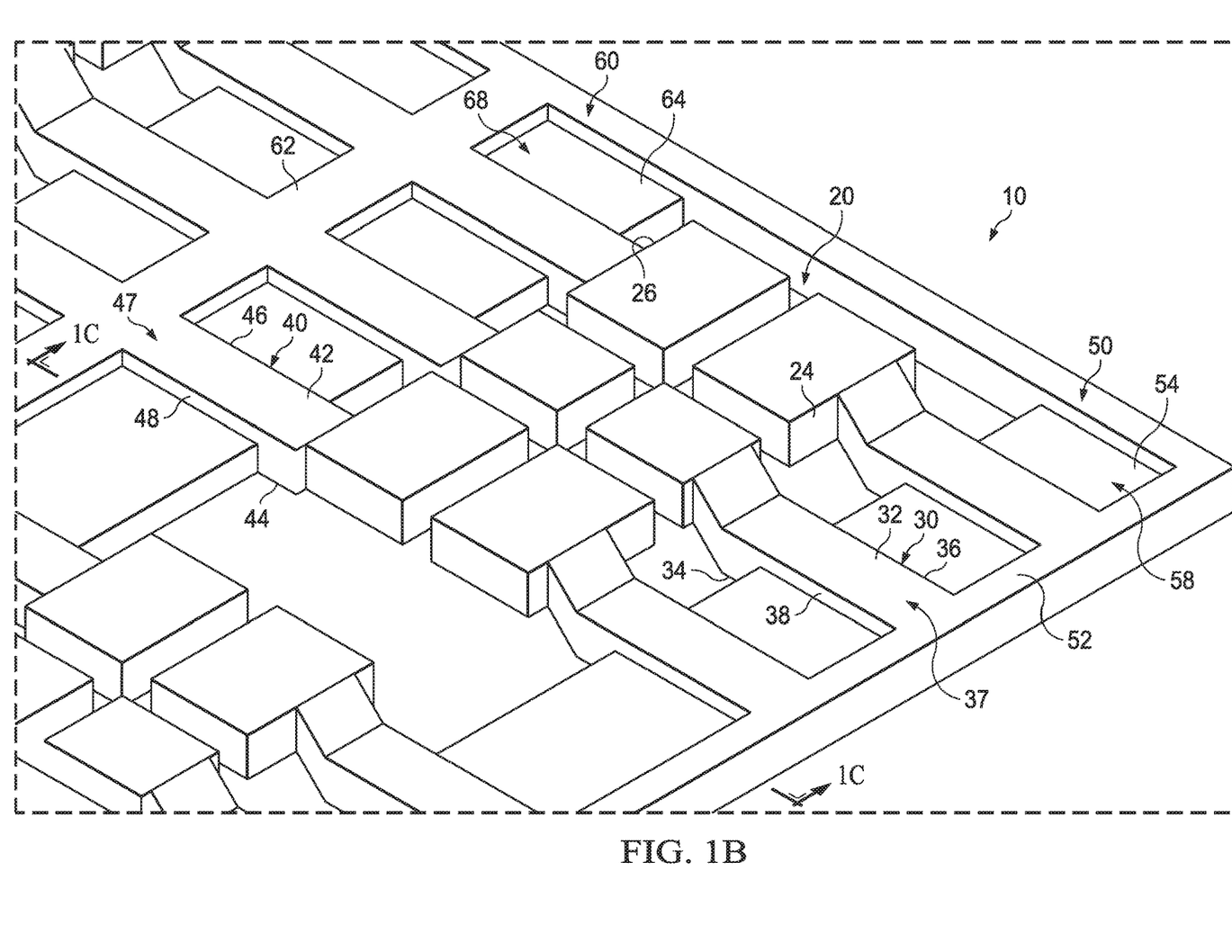
FIG. 1B is an enlarged view of a portion of the lead frame of FIG. 1A.
Figure 1C:
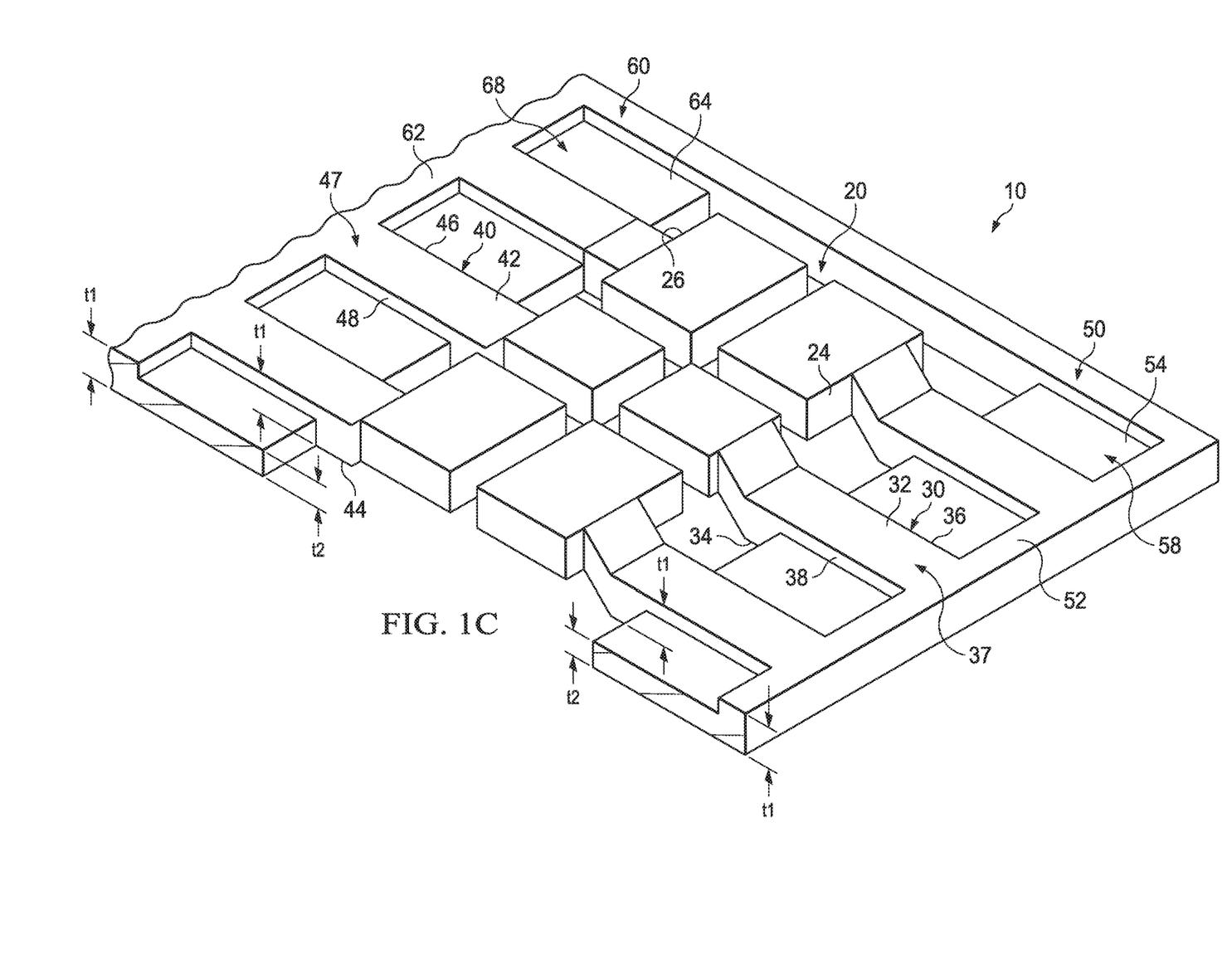
FIG. 1C is a section view taken along line 1C-1C of FIG. 1B.

FIGS. 1A-1C illustrate an example lead frame or base 10 used to form a semiconductor package. The semiconductor package can be, for example, a chip or die scale package, PCB scale or panel scale package or a wafer-level chip scale package (WLCSP) of integrated circuits. Consequently, the semiconductor package can be on the millimeter size scale or up to several feet in size.

The lead frame 10 has a planar, generally rectangular shape and extends generally along a centerline 12. The lead frame 10 includes one or more die pads 20. The die pads 20 can be formed from collective segments or portions (as shown) or as a single element (not shown). Regardless, each die pad 20 includes first and second lateral edges 24, 26 extending parallel to the centerline 12. Other relative orientations between the centerline 12 and lateral edges 24, 26 are contemplated. The lead frame 10 is formed from a conductive material, such as copper or a copper alloy. The lead frame 10 can be etched or stamped.

First leads 30 extend from each lateral edge 24 away from the respective die pad 20. Second leads 40 extend from each lateral edge 26 away from the respective die pad 20. The first and second leads 30, 40 have a first thickness $t_1$ (FIG. 1C). The first and second leads 30, 40 have a length of about 0.5 mm to about 0.7 mm measured from the lateral edges 24, 26 of the die pad 20.

As shown, the first leads 30 extend parallel to/coaxial with the second leads 40, i.e., the leads 30, 40 are not angled relative to one another. The leads 30, 40, however, could be angled relative to one another and extend transverse to the centerline 12 (not shown). In any case, the leads 30, 40 all extend in the same plane as one another. The leads 30, 40 extending from die pads 20 located on opposite sides of the centerline 12 can be interconnected at or near the centerline and can be coextensive with one another.

As shown in FIG. 1C, each lead 30 is rectangular in longitudinal cross-section and includes opposing, parallel first and second surfaces 32, 34 (top and bottom as shown). Each lead 30 also includes opposing, parallel third and fourth surfaces 36, 38 (left and right as shown). Similarly, each lead 40 is rectangular in longitudinal cross-section and includes opposing, parallel first and second surfaces 42, 44 (top and bottom as shown). Each lead 40 also includes opposing, parallel third and fourth surfaces 46, 48 (left and right as shown). It will be appreciated that the leads 30, 40 can have alternative cross-sections with the respective surfaces extending at non-parallel angles from one another (not shown).

A dam-bar 50 extends parallel to the centerline 12 and intersects an end 37 of each of the first leads 30. The dam-bar 50 is spaced from the lateral edge 24 of the die pad 20. The dam-bar 50 includes a first portion 52 and second portions 54. The first portion 52 is generally U-shaped and extends beyond the die pads 20 and leads 30 in both directions of the centerline 12. The second portions 54 extend from the first portion 50 towards the centerline 12 and are interdigitated with the leads 30.

The second portions 54 terminate prior to the die pads 20 and are therefore spaced therefrom. The first portion 52 has the first thickness $t_1$ and each second portion 54 has a second thickness $t_2$ less than the first thickness (see FIG. 1C). In one example, the second thickness $t_2$ is half the first thickness $t_1$.

Each second portion 54 abuts the third and fourth surfaces 36, 38 of the leads 30. Since the thickness $t_2$ of the second portions 54 is less than the thickness $t_1$ of the leads 30, portions of the third and fourth surfaces 36, 38 are exposed. A cavity 58 is formed in the space from the top (as shown) of the first portion 52 and the leads 30 down to the second portion 54. The cavity 58 extends between the exposed portions of the third and fourth surfaces 36, 38.

A dam-bar 60 extends parallel to the centerline 12 and intersects an end 47 of each of the second leads 40. The dam-bar 60 is spaced from the lateral edge 26 of the die pad 20. The dam-bar 60 includes a first portion 62 and second portions 64. The first portion 62 is generally U-shaped and extends beyond the die pads 20 and leads 40 in both directions of the centerline 12. The second portions 64 extend from the first portion 60 away from the centerline 12 and are interdigitated with the leads 40. The second portions 64 terminate prior to the die pads 20 and are therefore spaced therefrom. The first portion 62 has the first thickness $t_1$ and each second portion 64 has the second thickness $t_2$.

Each second portion 64 abuts the third and fourth surfaces 46, 48 of the leads 40. Since the thickness $t_2$ of the second portions 64 is less than the thickness $t_1$ of the leads 40, portions of the third and fourth surfaces 46, 48 are exposed.

A cavity 68 is formed in the space from the top (as shown) of the first portion 62 and the leads 40 down to the second portion 64. The cavity 68 extends between the exposed portions of the third and fourth surfaces 46, 48.

Figure 2:
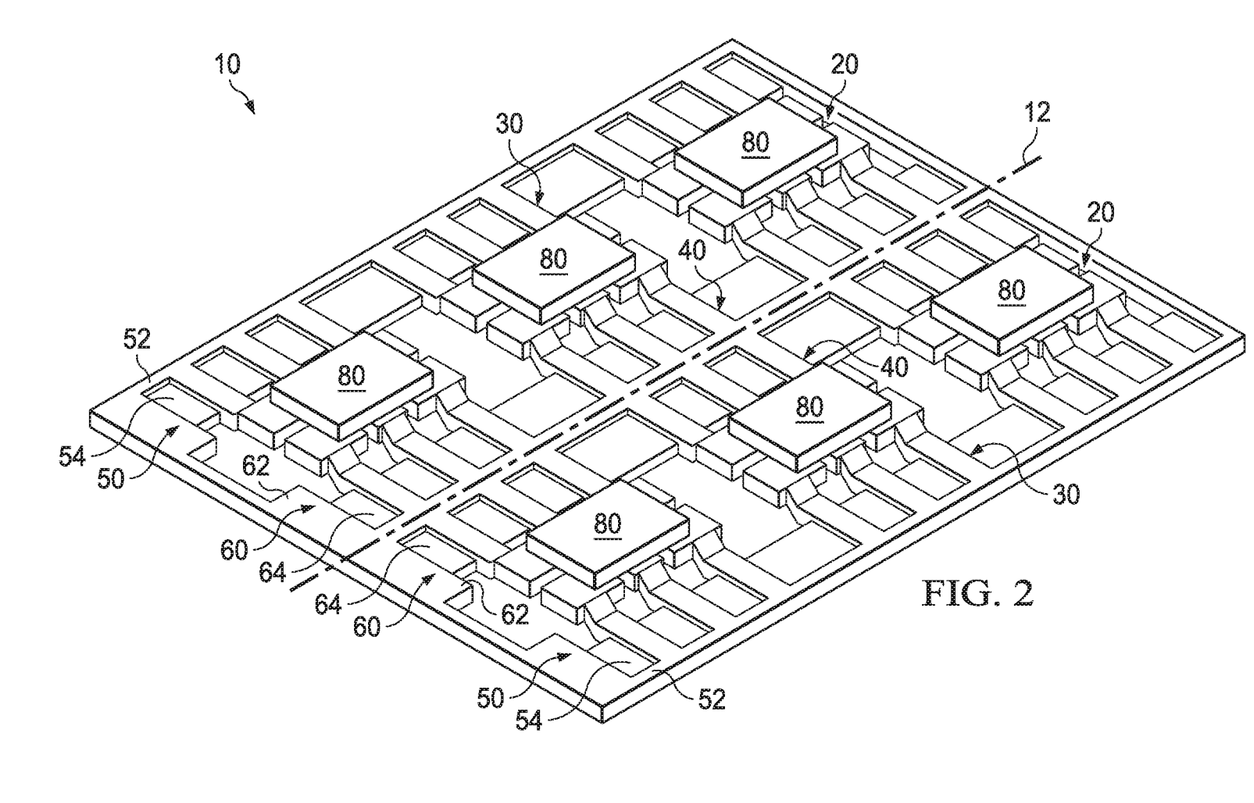
FIG. 2 is a schematic illustration of dies secured to pads on the lead frame of FIG. 1.

Referring to FIG. 2, a die 80 is secured to each die pad 20 via adhesive or the like. Integrated circuits (not shown) are fabricated or otherwise provided within each die 80 and electrically connected to the first and second leads 30, 40 associated with each die pad 20 in a known manner (not shown).

Figure 3A:
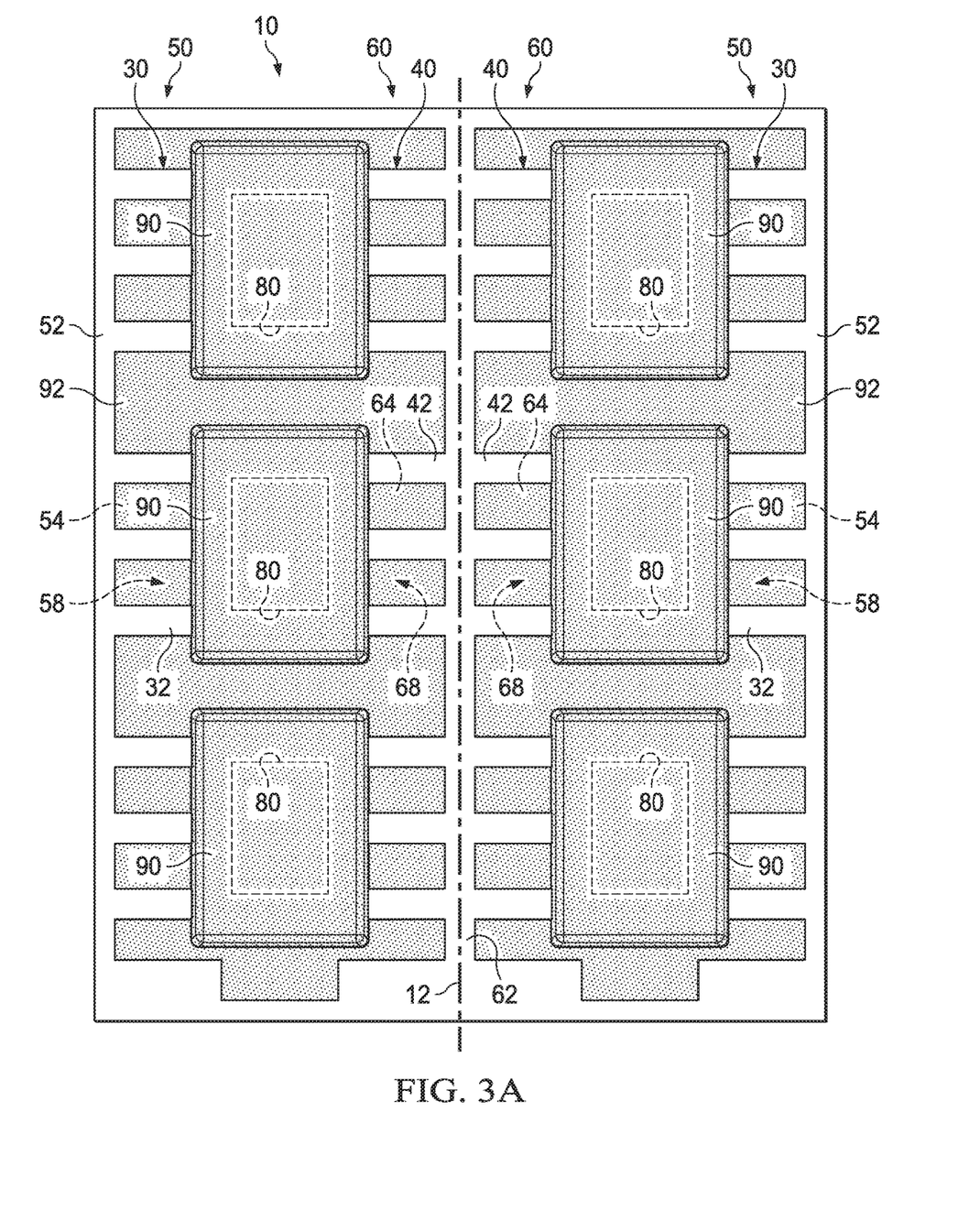
FIGS. 3A-3D are schematic illustrations of a process of overmolding and plating the dies and lead frame.

As shown in FIG. 3A, a layer 90 of material is provided over the lead frame 10 and dies 80 to encapsulate or encase the dies while exposing portions of the first and second leads 30, 40. The layer 90 is formed from an electrically insulating material, such as polyimide. In one example, the layer 90 is overmolded around the lead frame 10 and dies 80.

During overmolding, some of the material forming the insulating layer can seep out of the mold part line and cover portions of the leads 30, 40. More specifically, the mold flash 92 can flow outward and between the leads 30 to fill the cavities 58 in the dam-bar 50. Since the second portion 54 of the dam-bar 50 abuts the third and fourth surfaces 36, 38 of the leads 30, the mold flash 92 contacts only the exposed portions of the third and fourth surfaces. The remainder of the third and fourth surfaces 36, 38 is covered by the second portion 54. The first and second surfaces 32, 34 do not get covered by the mold flash 92 and are therefore exposed.

The mold flash 92 can also flow outward and between the leads 40 and fills the cavities 68 in the dam-bar 60. Since the second portion 64 of the dam-bar 60 abuts the third and fourth surfaces 46, 48 of the leads 40, the mold flash 92 contacts only the exposed portions of the third and fourth surfaces. The remainder of the third and fourth surfaces 46, 48 is covered by the second portion 64. The first and second surfaces 42, 44 do not get covered by the mold flash 92 and are therefore exposed.

Figure 3B:
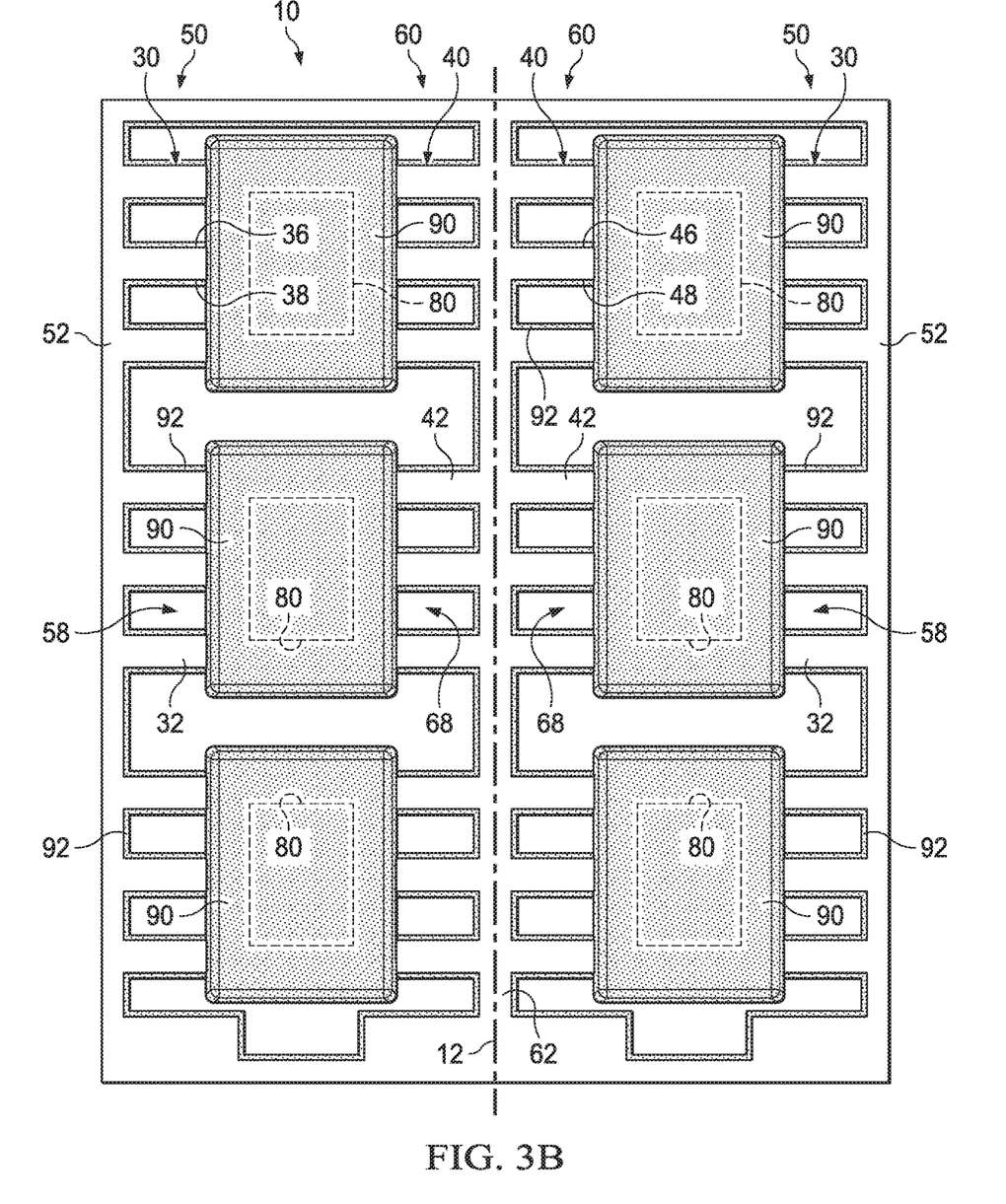

Referring to FIG. 3B, the overmolded lead frame 10 is trimmed by removing the mold flash 92 and second portions 54, 64 by, for example, punching. The mold flash 92 can be difficult to remove and, thus, portions of the third and fourth surfaces 36, 38, 46, 48 on the leads 30, 40 can still be covered with mold flash following trimming. Removing the second portions 54, 64, however, exposes the remainder of the third and fourth surfaces 36, 38, 46, 48. In other words, these portions of the third and fourth surfaces 36, 38, 46, 48 are free of contact with the mold flash 92 and exposed. The second portions 54, 64 of the dam-bars 50, 60 therefore act as barriers during overmolding to prevent contact with the mold flash 92.

Figure 3C:
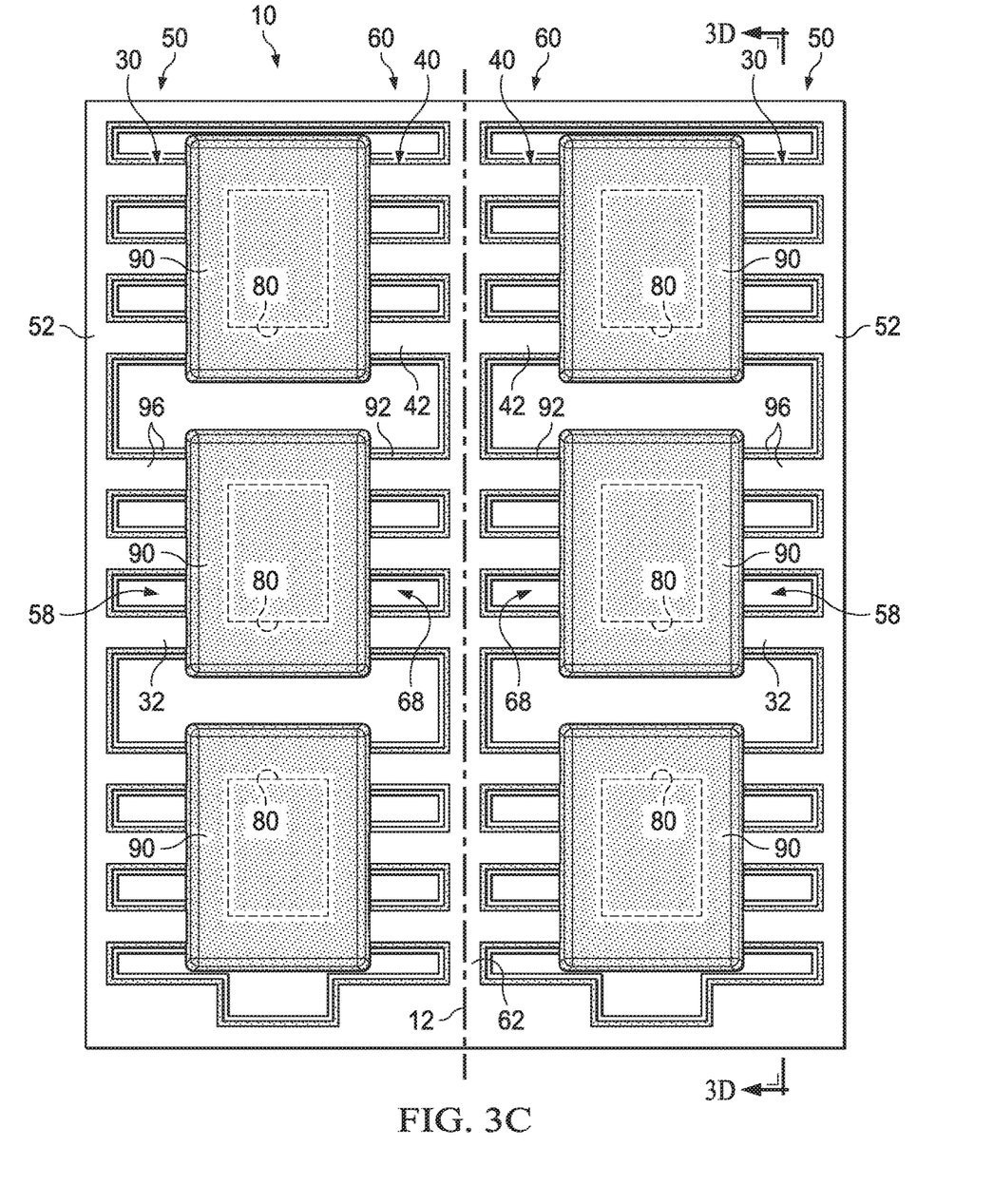
Figure 3D:
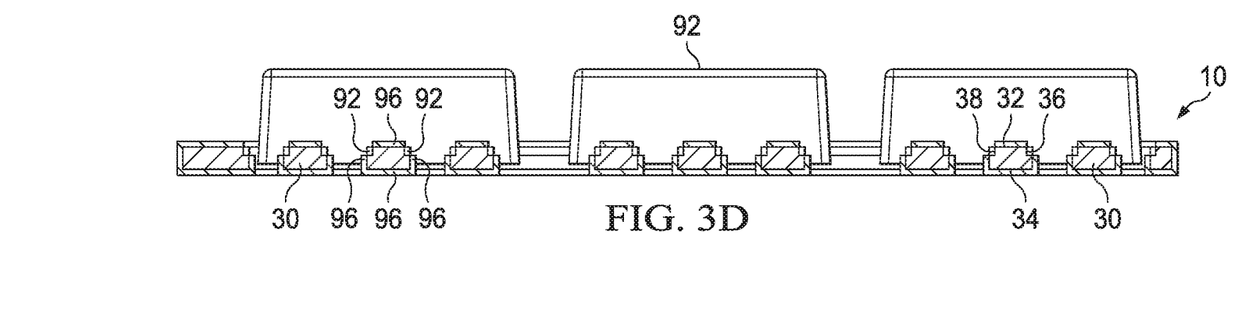

Referring to FIG. 3C-3D, the exposed portions of the lead frame 10, e.g., the leads 30, 40 and first portions 52, 62 of the damn-bars 50, 60 are then plated with an electrically conductive material 96 such as tin, silver or gold. More specifically, the entirely of the first and second surfaces 32, 34 and the exposed portions of the third and fourth surfaces 36, 38 are plated with the material 96. The entirely of the first and second surfaces 42, 44 and the exposed portions of the third and fourth surfaces 46, 48 are also plated with the material 96.

As a result, the plating 96 wraps partially around the ends 37, 47 of the leads 30, 40 and contacts multiple surfaces of each lead, e.g., the surfaces 32, 34, 36, 38 of the lead 30 and the surfaces 42, 44, 46, 48 of the lead 40. In other words, the plating 96 not only covers the parallel surfaces 32, 34 but also portions of the surfaces 36, 38 extending transverse or perpendicular to the surfaces 32, 34. Similarly, the plating 96 not only covers the parallel surfaces 42, 44 but also portions of the surfaces 46, 48 extending transverse or perpendicular to the surfaces 42, 44. Consequently, the plating 46 contacts/covers more than half of the entire outer surface of each end 37, 47.

The thickness $t_2$ of the second portions 54, 64 can be increased or decreased to adjust the degree to which the plating 46 covers the ends 37, 47. Thinner second portions 54, 64 [relative to the thickness of the leads 30, 40] will result in more mold flash 92 covering the surfaces 36, 38, 46, 48 and, thus, less plating thereon. On the other hand, thicker second portions 54, 64 [relative to the thickness of the leads 30, 40] will result in less mold flash 92 covering the surfaces 36, 38, 46, 48 and, thus, more plating thereon.

Figure 4:
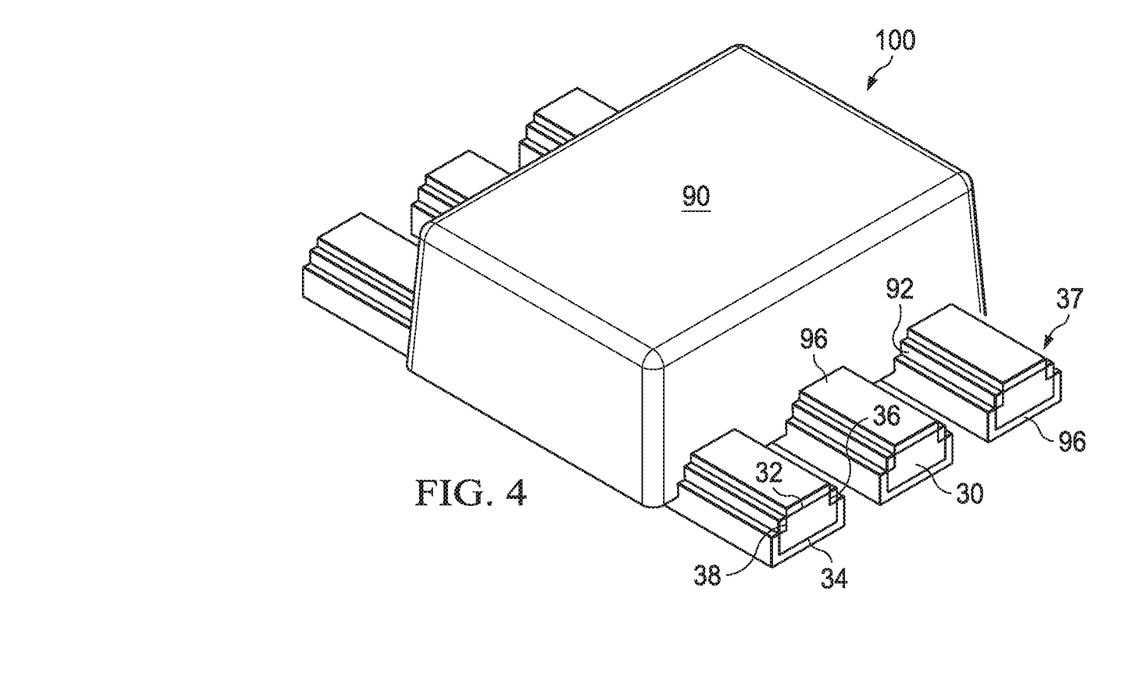
FIG. 4 is a perspective view of a semiconductor package formed from the singulated leadframe.

Following plating, the overmolded, plated lead frame is singulated into individual semiconductor packages 100 (FIG. 4). This step is omitted when the lead frame 10 includes a single die pad 20 and die 80. Regardless, when the dam-bars 50, 60 are removed from the lead frame 10, the ends 37, 47 of the leads 30, 40 become free ends having a length of about 0.1 mm to about 0.3 mm measured from the layer 90. These free ends 37, 47 form pins for mechanically and electrically connecting the semiconductor package 100 to a printed circuit board (PCB) (not shown). Due to the presence of the reduced thickness portions 54, 64 of the dam-bars 50, 60 during overmolding, the free ends 37, 47 have an increased surface area covered with the plating material 96 compared to existing leads. This advantageously increases the connection between the leads 30, 40 and the PCB.

As noted, when the insulating layer is provided over the dies and lead frame, some of the material forming the insulating layer can seep out of the mold part line and cover portions of the leads. This seepage is commonly referred to as lead flash, and may be present after the lead frame is cut and trimmed to remove any dam-bars and excess material. The leftover lead flash can result in downstream issues with soldering.

That said, the lead flash can be removed in a deflashing process using chemical immersion, e.g., using a surfactant and wetting agent, which softens the lead flash before being removed via mechanical force, e.g., water jet. Alternatively, the lead flash can be removed electrically. These deflashing processes, however, may not always remove all the lead flash. Solderability issues between the leads and PCB can be particularly problematic when the leads are relatively short and/or do not include bends, such as with gull-wing leads. To this end, the leftover lead flash can cover portions of the free ends of the leads The leads and lead frame shown and described herein are advantageous by allowing for better lead flash removal. More specifically, providing the reduced thickness portion of the dam-bar reduces the amount of lead flash that can form on the leads during overmolding. As a result, there is less lead flash to be removed during the chemical/electrical deflashing process compared to lead frames that do not include the reduced thickness dam-bar.

This lead frame configuration can also improve the reliability of the semiconductor package by allowing for a better solder connection between the free ends of the leads and the PCB. In particular, since portions of the third and fourth surfaces of the leads are plated instead of completely covered with mold flash, the free ends of the leads are better suited for solder with the PCB. More specifically, the plated surfaces increase the wettability of the solder used to attach the leads to the PCB, thereby increasing the reliability of the connection. Enabling solder to attach to the third and fourth surfaces of the leads also facilitates inspection of the solder connections.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A semiconductor package, comprising:
a die pad;
leads attached to and extending from the die pad each having a free end and outer surfaces;
a die attached to the die pad and electrically connected to the leads;
an insulating layer extending over a first portion of the leads and the die such that a second portion of the leads including the free ends are exposed outside of the insulating layer; and
an electrically conductive material plating some, but not all, of the outer surfaces of the second portion of the leads.

2. The semiconductor package recited in claim 1, wherein the electrically conductive material comprises tin.

3. The semiconductor package recited in claim 1, wherein each lead is rectangular and the outer surfaces comprise top and bottom outer surfaces and side outer surfaces which are opposing surfaces.

4. The semiconductor package recited in claim 1, wherein the leads extend in the same plane as one another.

5. The semiconductor package recited in claim 1, wherein the free ends have a length of about 0.1 mm to about 0.3 mm.

6. The semiconductor package recited in claim 1, wherein the outer surfaces include opposing side surfaces between the top and bottom surfaces.

7. A semiconductor package, comprising:
a die pad;
leads attached to and extending from the die pad each having a free end and outer surfaces, wherein each lead is rectangular and the outer surfaces comprise top and bottom outer surfaces and side outer surfaces which are opposing surfaces;
a die attached to the die pad and electrically connected to the leads;
an insulating layer extending over a first portion of the leads and the die such that a second portion of the leads including the free ends are exposed outside of the insulating layer; and
an electrically conductive material plating some, but not all, of the outer surfaces of the second portion of the leads, wherein the plating material covers up to half of the opposing side outer surfaces of the second portion of the leads.

8. A semiconductor package, comprising:
a die pad;
leads attached to and extending from the die pad each having a free end and outer surfaces, wherein each lead is rectangular and the outer surfaces comprise top and bottom outer surfaces and side outer surfaces which are opposing surfaces;
a die attached to the die pad and electrically connected to the leads;
an insulating layer extending over a first portion of the leads and the die such that a second portion of the leads including the free ends are exposed outside of the insulating layer; and
an electrically conductive material plating some, but not all, of the outer surfaces of the second portion of the leads, wherein the plating material wraps around the top and bottom outer surfaces of the second portion of the leads.

9. A method of manufacturing a semiconductor package, comprising the steps of:
providing a lead frame having a die pad and leads extending from the die pad to a dam bar, the leads having a first thickness and outer surfaces extending at angles from one another, the dam bar having a first portion having the first thickness and a second portion having a second thickness less than the first thickness to form a cavity;
attaching a die to the die pad;
electrically connecting the die to the leads;
overmolding the lead frame with an electrically insulating material that fills the cavity and leaves free ends of the leads exposed;
removing the electrically insulating material from the cavity;
plating the overmolded lead frame with an electrically conductive material that covers at least portions of the outer surfaces; and
removing the dam bar.

10. The method recited in claim 9, wherein the electrically conductive plating material comprises tin.

11. The method recited in claim 9, wherein each lead is rectangular and the outer surfaces comprise opposing first and second surfaces and opposing third and fourth surfaces, the electrically conductive plating material covering the first and second surfaces and at least partially covering the third and fourth surfaces.

12. The method recited in claim 11, wherein the entirety of the first and second surfaces are exposed following overmolding and prior to removing the electrically insulating material from the cavity.

13. The method recited in claim 9, wherein plating the overmolded lead frame with an electrically conductive material covers half of the third surface and half of the fourth surface.

14. The method recited in claim 9, wherein plating the overmolded lead frame with an electrically conductive material wraps the plating around the outer surfaces.

15. The method recited in claim 9, wherein the leads extend in the same plane as one another.

16. The method recited in claim 9, wherein the free ends have a length of about 0.1 mm to about 0.3 mm.

17. The method recited in claim 9, wherein the die pad comprises multiple pieces, each piece connected to one of the leads.

18. The method recited in claim 17, wherein the multiple pieces are physically separate from each other.

19. A method of manufacturing a semiconductor package, comprising the steps of:
providing a lead frame having leads extending to a dam bar, the dam bar having a first portion having the first thickness and a second portion having a second thickness less than the first thickness to form a cavity;
attaching a die to a surface of the leads opposite the dam bar;
filling the cavity with insulating material and leaving free ends of the leads exposed;

removing the electrically insulating material from the cavity;

plating exposed portions of the lead frame; and removing the dam bar.

20. A semiconductor package, comprising:

a multiple piece die pad;

multiple leads each having top, bottom and side outer surfaces and one end attached to and extending from a piece of the die pad and a free end with the top, bottom and side outer surfaces extending at angles from one another;

a die attached to the die pad and electrically connected to the leads;

an insulating layer extending over a first portion of the leads and the die such that a second portion of the leads including the free ends are exposed outside of the insulating layer; and an electrically conductive material plating the top and bottom outer surfaces and some, but not all, of the side outer surfaces of the second portion of the leads.

21. The semiconductor package recited in claim 20, wherein side surfaces are opposing side surfaces between the top and bottom surfaces.

22. A semiconductor package, comprising:

multiple leads attached to and extending from a die pad, each of the leads having a free end with top, bottom and side outer surfaces extending at angles from one another;

an insulating layer extending over a first portion of the leads and the die such that a second portion of the leads including the free ends are exposed outside of the insulating layer; and an electrically conductive material plating the top and bottom outer surfaces and some, but not all, of the side outer surfaces of the second portion of the leads.

23. The semiconductor package recited in claim 22, wherein the die pad comprises multiple pieces, each piece connected to one of the leads.

24. The semiconductor package recited in claim 23, wherein the multiple pieces are physically separate from each other.

25. The semiconductor package recited in claim 20, wherein any portion of a lead not plated is on at least one of the two opposing side surfaces.

26. The semiconductor package recited in claim 22, wherein side surfaces are opposing side surfaces between the top and bottom surfaces.

27. The semiconductor package recited in claim 26, wherein any portion of a lead not plated is on at least one of the two opposing side surfaces.

28. A semiconductor package, comprising:

a die pad;

leads attached to and extending from the die pad each having a free end and outer surfaces, wherein the outer surfaces include opposing side surfaces between top and bottom surfaces;

a die attached to the die pad and electrically connected to the leads;

an insulating layer extending over a first portion of the leads and the die such that a second portion of the leads including the free ends are exposed outside of the insulating layer; and an electrically conductive material plating some, but not all, of the outer surfaces of the second portion of the leads, wherein any portion of a lead not plated is on at least one of the two opposing side surfaces.

* * * * *